(12) United States Patent
Park

(10) Patent No.: US 7,633,329 B2
(45) Date of Patent: Dec. 15, 2009

(54) SINGLE SIGNAL-TO-DIFFERENTIAL SIGNAL CONVERTER AND CONVERTING METHOD

(75) Inventor: Youn-Sik Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 42 days.

(21) Appl. No.: 12/107,690

(22) Filed: Apr. 22, 2008

(65) Prior Publication Data

US 2008/0265964 A1  Oct. 30, 2008

(30) Foreign Application Priority Data

Apr. 25, 2007  (KR) ..................... 10-2007-0040340

(51) Int. Cl.
*H03K 17/00* (2006.01)

(52) U.S. Cl. .................. 327/415; 327/416; 327/112

(58) Field of Classification Search ................ None
See application file for complete search history.

(56) References Cited

U.S. PATENT DOCUMENTS

| 7,119,602 | B2 | 10/2006 | Davis | |
|---|---|---|---|---|
| 2002/0075059 | A1* | 6/2002 | Takahashi | 327/415 |
| 2008/0136467 | A1* | 6/2008 | Tambouris et al. | 327/111 |
| 2009/0122635 | A1* | 5/2009 | Booth et al. | 365/233.12 |
| 2009/0128322 | A1* | 5/2009 | Henzler et al. | 340/527 |

FOREIGN PATENT DOCUMENTS

| JP | 2003-101390 | 4/2003 |
|---|---|---|
| KR | 10-0688591 | 2/2007 |

OTHER PUBLICATIONS

English language abstract of Japanese Publication No. 2003-101390.
English language abstract of Korean Publication No. 10-0688591, Feb. 22, 2007.
Park et al., "PVT-Invariant Single-to-Differential Data Converter with Minimum Skew and Duty-Ratio Distortion", 2008 IEEE International Symposium on Circuits and System, May 18-21, 2008.

* cited by examiner

*Primary Examiner*—Tuan Lam
*Assistant Examiner*—Hiep Nguyen
(74) *Attorney, Agent, or Firm*—Volentine & Whitt, PLLC

(57) ABSTRACT

In an example embodiments, a single signal-to-differential signal converter includes a first inverter for receiving and inverting a single input signal and outputting an inverted single input signal to a first node, and a first differential signal generating portion for generating a first signal and an inverted first signal which have the opposite phases to each other to second and third nodes in response to the single input signal. The single signal-to-differential signal converter further includes a second differential signal generating portion for generating a second signal and an inverted second signal which have the opposite phases to each other to the second and third nodes in response to the inverted single input signal, wherein the single signal-to-differential signal converter outputs differential signals such that the first and second signals applied to the second node are merged by a phase interpolation and the inverted first and second signals applied to the third node are merged by a phase interpolation.

15 Claims, 3 Drawing Sheets

SINGLE SIGNAL-TO-DIFFERENTIAL SIGNAL CONVERTER AND CONVERTING METHOD

CROSS-REFERENCE TO RELATED APPLICATIONS

This application claims the benefit of Korean Patent Application No. 2007-0040340, filed on 25 Apr. 2007, the disclosure of which is hereby incorporated herein by reference in its entirety.

BACKGROUND

1. Technical Field

This disclosure relates to a Single Signal-to-Differential Signal (SS-DS) converter, and more particularly, to a SS-DS converter and a SS-DS converting method which uses a phase interpolation method.

2. Description of the Related Art

A SS-DS converter is a device which receives a single signal as an input signal and outputs two differential signals which have opposite phases to each other, and it is represented by a phase splitter or a phase divider.

Many signals are used in a semiconductor device, and these signals are used as a single signal or a differential signal according to a need. When the single signal is used, there are advantages in that a circuit configuration is simplified and power consumption is low, and so most of the semiconductor devices use the single signal as a basic signal. However, the single signal changes an amount of electrical current consumption according to a signal level and causes induced electromotive force by the parasitic inductance in a power line through which electrical power is supplied. The induced electromotive force is a sort of a noise, and it reduces a voltage margin and a time margin of a signal to restrict an operating speed of a semiconductor device.

On the other hand, the differential signal has constant power consumption, and so using the differential signal can reduce a noise much more than using the single signal. Using the differential signal, it is easy to remove a noise from a signal by using a circuit such as a differential amplifier which amplifies the difference between two signals. The differential signal is used to control a switch of a pipeline, to control a double data rate signaling, or to control a transmission gate of a circuit. When serial data are transferred to an output terminal by sampling parallel data in a SDRAM by using a rising edge and a falling edge of the same output clock like a double data rate SDRAM, only the differential signal can be used as the output clock. However, since in case of the differential signal, two differential signals of the same function should be used, and power consumption is high. Therefore, since power consumption is too high if the differential signal is used to represent all signals of the semiconductor device, the typical semiconductor device uses the single signal as a basic signal and generates and uses the differential signal according to a need. Therefore, many semiconductor devices require a SS-DS converter which converts the single signal to the differential signal when the differential signal is required. Here, the single signal and the differential signal can represent all digital signals such as a clock signal and a data signal.

The performance of the SS-DS converter is relative to the performance of a device in which the SS-DS converter is used and is determined by whether to perform a high speed operation, a skew, a slope of a signal, a duty rate, low power consumption, and the layout area size. The skew denotes a delay time difference that the single signal is applied and the differential signal is outputted. The SS-DS converter receives the single signal and outputs two output signals whose phases are opposite and delay times are same as the differential signals. If a skew which is a delay time difference occurs between the two output signals, an operating time difference occurs in circuits which respectively receive the outputs to operate, and thus it is difficult to perform a normal operation. The slope of the signal relates a time of a rising/falling transition of the differential signal, and if the slope of the signal is small, a timing margin that the circuits which use the differential signal can detect the signal is reduced, whereby a stable operation can not be secured, and power consumption is increased in a CMOS circuit configuration. The duty rate represents a time rate occupied by a certain level during one cycle of a signal of a pulse form. When the signal used for a circuit synchronization such as a clock signal, it is preferable that the duty rate of the signal is set to 50% so that a time of a high level state and a time of a low level state are equal. However, since a PMOS transistor and an NMOS transistor which are usually used in the semiconductor device have a difference in operating characteristics, the duty rate of the signal may often be distorted. A circuit which has received the distorted signal can normally operate only when it operates according to a level having a shorter time among signal levels.

FIG. 1 is a circuit diagram illustrating a SS-DS converter according to a conventional art. The SS-DS converter of FIG. 1 comprises a plurality of inverters Inv1 to Inv5. The two inverters Inv1 and Inv4 constitute a first path through which an input signal sig_in is received and delayed during a predetermined time period, and then a first output signal sig_out is outputted. The three inverters Inv2, Inv3 and Inv5 constitute a second path through which the input signal sig_in is received, delayed during a predetermined period and inverted, and then a second output signal sig_outB having the opposite phase to the input signal sig_in. The first output signal sig_out and the second output signal sig_outB are differential signals which have the opposite phase to each other.

In FIG. 1, since the first path comprises the two inverters Inv1 and Inv4 and the second path comprises the three inverters Inv2, Inv3 and Inv5, and thus the delay times of the first and second paths differ from each other. Since the delay times of the first and second paths differ from each other, the skew occurs between the first output signal sig_out and the second output signal sig_outB, so that a circuit which receives the differential signals sig_out and sig_outB outputted from the SS-DS converter may not operate normally. Therefore, there is a need for removing the skew between the first output signal sig_out and the second output signal sig_outB.

In FIG. 1, in order to remove the skew between the first and second output signals sig_out and sig_outB, the first inverter Inv1 has a different configuration from the other inverters Inv2 to Inv5. That is, used is a delay matching method in which a delay time difference between the first and second output signals sig_out and sig_outB is reduced by adjusting the sizes of the physical inverters between the first and second paths. The delay matching method is a technique in which in the process for adjusting the delay time of the first path to be equal to the delay time of the second path, the PMOS transistor and the NMOS transistor are designed so that delay elements can be matched, so that stable characteristics for a variation on a process, a voltage and a temperature (hereinafter, PVT) is obtained.

In FIG. 1, the third converter Inv3 representatively shows a configuration of the inverters Inv2 to Inv5 except the first inverter Inv1. Each of the inverters Inv2 to Inv5 comprises a PMOS transistor P3 and an NMOS transistor N3 which are serially connected between a power voltage VDD and a ground voltage VSS and receives a signal through a gate terminal. On the other hand, the first inverter Inv1 comprises two PMOS transistors P1 and P2 and two NMOS transistors N1 and N2 which are serially connected between the power voltage VDD and the ground voltage VSS as shown in FIG. 1. The PMOS transistor P1 and the NMOS transistor N1 receive a signal through a gate terminal like the other inverters. However, the PMOS transistor P2 connected to the power voltage VDD receives the ground voltage VSS through a gate terminal, and the NMOS transistor N2 connected to the ground voltage VSS receives the power voltage VDD through a gate terminal. That is, the PMOS transistor P2 and the NMOS transistor N2 are always in an ON state.

The PMOS transistor P2 and the NMOS transistor N2 are provided such that the first inverter Inv1 delays the input signal sig_in by the same time as a time that the second and third inverters Inv2 and Inv3 of the second path delay the input signal sig_in.

In FIG. 1, a skew between the first output signal sig_out and the second output signal sig_outB is reduced such that the first inverter Inv1 is configured differently from the inverters Inv2 to Inv5 and the number and the size of the transistors P1, P2, N1, and N2 which constitute the first inverter Inv1 are adjusted.

The SS-DS converter of FIG. 1 is not suitable for the high speed operation since the slope of the signals from between the first inverter Inv1 and the fourth inverter Inv4 is degraded, and the current lost in the fourth inverter Inv4 which has received the output signal of the first inverter Inv1 which has the low signal slope is large. It handles the PVT variation by using the delay matching method, but since a configuration of the first path and a configuration of the second path are asymmetric, there is a limitation to cope with the PVT variation. The asymmetric structure in the configuration of the first and second paths causes a duty rate distortion of the differential signal.

In FIG. 1, the fourth and fifth inverters Inv4 and Inv5 are output drivers, and the first to third inverters Inv1 to Inv3 are used for a SS-DS converting operation.

FIG. 2 is a circuit diagram illustrating a SS-DS converter according to another conventional art. One of the problems of the SS-DS converter of FIG. 1 is that the first path and the second path are different in the number of the inverters. In order to resolve the problem of the SS-DS converter of FIG. 1, the SS-DS converter of FIG. 2 employs a transmission gate TG1. As shown in FIG. 1, the inverter comprises the MOS gate. Therefore, the transmission gate TG1 which is the MOS gate is added to the first path for delay matching of the first and second paths. Since the transmission gate TG1 is added, a sixth inverter Inv6 which has the same configuration as the inverters Inv2 to Inv5 is used instead of the first inverter Inv1.

The SS-DS converter of FIG. 2 adds the transmission gate TG1 to match the delay times of the first and second paths, but since the output signal of the transmission gate TG1 is different in signal slope from the output signal of the inverter, in order to control this, it is needed to adjust the size of the fourth inverter Inv4. However, adjusting the size of the fourth inverter Inv4 causes an asymmetric structure between the first path and the second path. For these reasons, like the SS-DS converter of FIG. 1, the SS-DS converter of FIG. 2 is not suitable for the high speed operation, and has a limitation to cope with the PVT variation.

FIG. 3 is a circuit diagram illustrating a SS-DS converter which improves upon the SS-DS converter of FIG. 2. As was mentioned above, in the SS-DS converter of FIG. 2, the first path and the second path are asymmetric since the output signal slope of the transmission gate TG1 differs from the output signal slope of the inverter.

In FIG. 3, a buffer Buf1 is added to match the output signal slope of the transmission gate TG1 with the output signal slope of the inverter. The buffer Buf1 comprises an NMOS transistor N4 and a PMOS transistor P4 which are serially connected between the power voltage VDD and the ground voltage VSS. The gate terminals of the NMOS transistor N4 and the PMOS transistor P4 receive an output signal of a sixth inverter Inv6. Since the buffer Buf1 is a delay element which comprises a MOS gate, if the transmission gate TG1 and the buffer Buf1 are independently used, there occurs a delay time difference between the first and second paths due to the delay time of the buffer Buf1. In FIG. 3, in order to prevent the delay time difference caused by the buffer Buf1, the buffer Buf1 is configured such that the gate terminals of the NMOS transistor N4 and the PMOS transistor P4 receive the output signal of the sixth inverter Inv6. Therefore, if the sixth inverter Inv6 inverts and delays the input signal sig_in and outputs the result, the output signal of the sixth inverter Inv6 is simultaneously applied to the transmission gate TG1 and the buffer Buf1, and the output signal of the transmission gate TG1 is added to the output signal of the buffer Buf1, thereby correcting the output signal slope of the transmission gate TG1. Therefore, the signal applied to the fourth inverter Inv4 has a higher slope than the signal applied to the fourth inverter Inv4 of when the transmission gate TG1 is used like FIG. 2. A range for adjusting the size of the fourth inverter Inv4 which is the output driver is significantly reduced compared to the single signal-to-differential signal converter of FIG. 2, and since a signal transitioning time is shorter, power consumption is reduced.

However, as a result of simulating the SS-DS converter of FIG. 3, the waveform of the differential signal is improved compared to the SS-DS converter of FIG. 2, but there is still a need for adjusting the size of the fourth inverter Inv4. Therefore, the first path and the second path are asymmetric in structure, and there is a limitation to cope with the PVT variation, leading to the duty rate distortion.

SUMMARY

Some example embodiments provide a SS-DS converter which is suitable for the high speed operation and is capable to cope with the PVT variation by using the phase interpolation method. Other example embodiments provide a single signal-to-differential signal converting method which can achieve the above object.

According to an example embodiment, a SS-DS converter includes a first inverter for receiving and inverting a single input signal and outputting an inverted single input signal to a first node, a first differential signal generating portion for generating a first signal and an inverted first signal which have the opposite phases to each other to second and third nodes in response to the single input signal, and a second differential signal generating portion for generating a second signal and an inverted second signal which have the opposite phases to each other to the second and third nodes in response to the inverted single input signal. The differential signals are outputted such that the first and second signals applied to the second node are merged by a phase interpolation and the inverted first and second signals applied to the third node are merged by a phase interpolation.

The first differential signal generating portion includes a first buffer for buffering the input signal to output the first signal to the second node and a second inverter for inverting the input signal to output the inverted first signal to the third node.

The second differential signal generating portion includes a third inverter for inverting the inverted input signal to output the second signal to the second node and a second buffer for buffering the inverted input signal to outputting the inverted second signal to the third node.

The SS-DS converter further includes an output driver for externally outputting the differential signals generated at the second and third nodes. The output driver includes a fourth inverter for inverting the signal of the second node and outputting the inverting result, and a fifth inverter for inverting the signal of the third node and outputting the inverting result.

The SS-DS converter further comprises a latch portion for adjusting a rising/falling transition time of the differential signals generated at the second and third nodes. The latch portion includes a sixth inverter for inverting the signal of the second node and outputting the inverting result to the third node, and a seventh inverter for inverting the signal of the third node and outputting the inverting result to the second node.

The SS-DS converter further includes at least one additional latch portion for adjusting a rising/falling transition time of the differential signals generated from the output driver and at least one additional output driver, wherein the at least one additional latch portion and the at least one additional output driver are alternately connected.

According to another example embodiment, a SS-DS converting method includes generating a first signal pair in which phases are opposite to each other in response to an input signal, inverting the input signal to generate an inverted input signal, generating a second signal pair in which phases are opposite to each other in response to the inverted input signal, and merging signals having the same phase from the first signal pair and the second signal pair by a phase interpolation to generate a differential signal pair, thereby offsetting a delay time difference of the first and second signal pairs.

Generating the first signal pair may include buffering the input signal to output a first signal, and inverting the input signal to output an inverted first signal. Generating the second signal pair may include inverting the inverted input signal to output a second signal, and buffering the inverted input signal to output an inverted second signal.

The SS-DS converting method may further include externally outputting the differential signal pair. Externally outputting the differential signal pair may include inverting the differential signal pair and then outputting the inverting result, respectively.

The SS-DS converting method may further include adjusting a rising/falling transition time of the differential signal pair. Adjusting the rising/falling transition time of the differential signal pair includes inverting a differential signal of the differential signal pair to adjust a rising/falling transition time of an inverted differential signal, and inverting the inverted differential signal of the differential signal pair to adjust a rising/falling transition time of the differential signal.

BRIEF DESCRIPTION OF THE DRAWINGS

The above and other features and advantages of the invention will become more apparent by describing in detail example embodiments thereof with reference to the attached drawings, in which.

DETAILED DESCRIPTION OF EXAMPLE EMBODIMENTS

Figure 1:
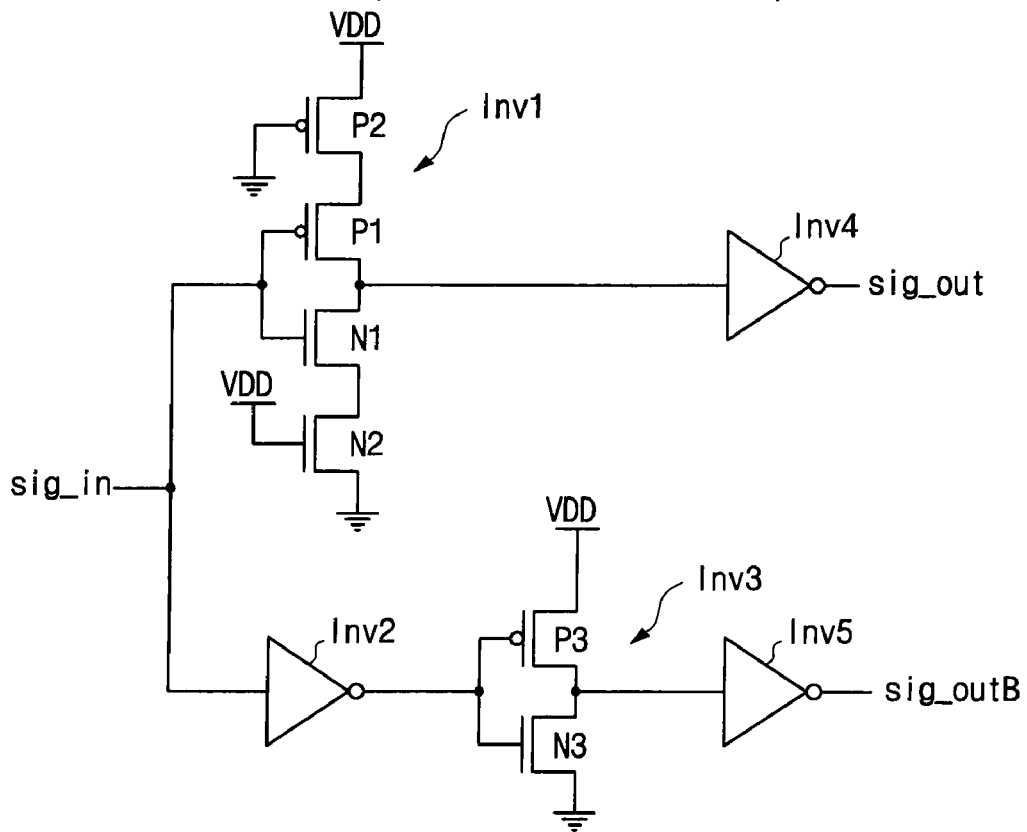
FIG. 1 is a circuit diagram illustrating a SS-DS converter according to a conventional art.

The invention will now be described more fully hereinafter with reference to the accompanying drawings, in which example embodiments are illustrated. The invention may, however, be embodied in different forms and should not be construed as limited to the embodiments set forth herein. Rather, these embodiments are provided so that this disclosure is thorough and complete, and conveys the scope of the invention to those skilled in the art. In the drawings, the thickness of layers and regions are exaggerated for clarity. Furthermore, like numbers refer to like elements throughout the specification.

Figure 4:
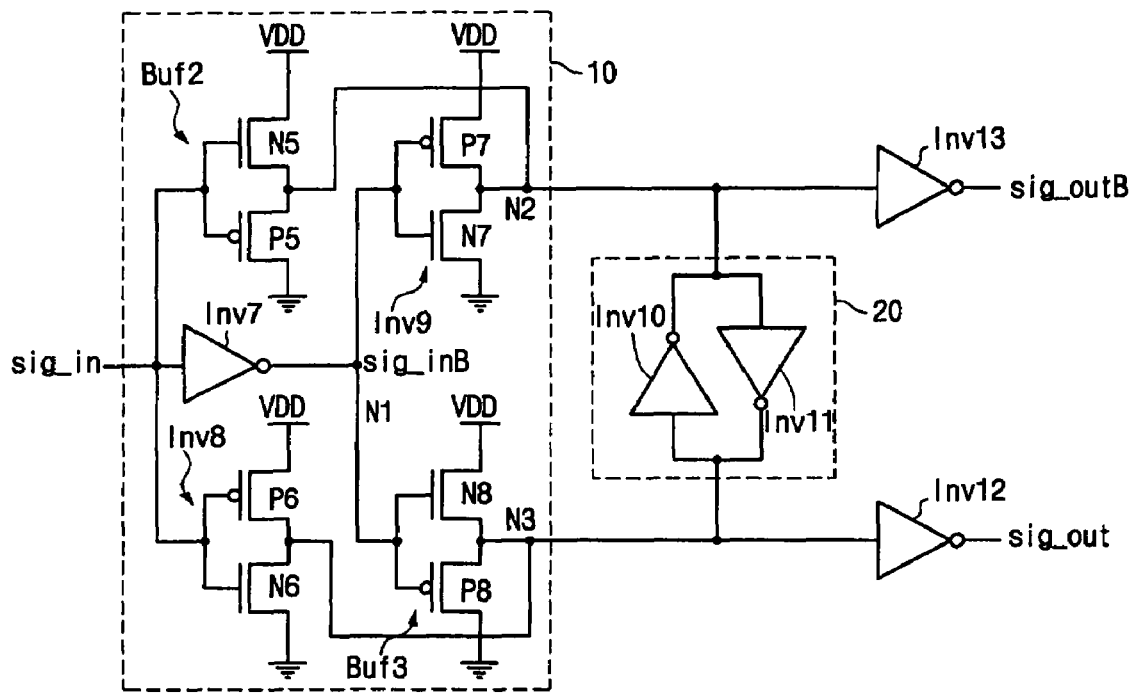
FIG. 4 is a circuit diagram illustrating a SS-DS converter according to an example embodiment.

FIG. 4 is a circuit diagram illustrating a SS-DS converter according to an example embodiment. The SS-DS converter of FIG. 4 includes a differential signal generating portion 10 and a latch portion 20. The differential signal generating portion 10 receives the input signal sig_in to generate the differential signal, and the latch portion 20 raises the slope of the differential signal generated from the differential signal generating portion 10.

The differential signal generating portion 10 includes three inverters Inv7 to Inv9 and two buffers Buf2 and Buf3. The buffer Buf2 receives and delays the input signal sig_in and outputs a signal having the same phase as the input signal sig_in to a second node N2. The inverter Inv8 receives, inverts and delays the input signal sig_in and outputs a signal having the opposite phase to the input signal sig_in to a third node N3. The inverter Inv7 inverts the input signal sig_in and outputs the inverted input signal sig_inB to a first node N1. The inverter Inv9 inverts and delays the inverted input signal sig_inB and outputs a delayed signal having the same phase as the input signal sig_in to a second node N2. The buffer Buf3 delays the inverted input signal sig_inB and outputs a delayed signal having the opposite phase to the input signal sig_inB to the third node N3.

The signal outputted from the buffer Buf2 and the signal outputted from the inverter Inv9 are applied to the second node N2. The signal outputted from the buffer Buf2 and the signal outputted from the inverter Inv9 have the same phase. However, the signal outputted from the buffer Buf2 is delayed by a delay time of the buffer Buf2 and then applied to the second node N2, whereas the signal outputted from the inverter Inv9 is delayed by a delay time of the two inverters Inv7 and Inv9 and then applied to the second node N2, whereby a delay time difference occurs between the two signals applied to the second node N2.

When the two signals which have the delay time difference and the same phase are applied to the second node N2, the two signals are added into one signal having a delay time between the delay times of the two signals by the phase interpolation. That is, the two signals are added into one signal such that the delay time of the signal outputted from the buffer Buf2 is increased, and the delay time of the signal outputted from the inverter Inv9 is decreased.

The signal outputted from the buffer Buf3 and the signal outputted from the inverter Inv8 are applied to the node N3. The signal outputted from the buffer Buf3 and the signal outputted from the inverter Inv8 have the same phase. However, the signal outputted from the inverter Inv8 is delayed by a delay time of the inverter Inv8 and then applied to the second node N3, whereas the signal outputted from the buffer Buf3 is delayed by a delay time of the inverter Inv7 and the buffer Buf3 and then applied to the third node N3, whereby a delay time difference occurs between the two signals applied to the second node N3.

Similarly to the second node N2, when the two signals which have the delay time difference and the same phase are applied to the second node N3, the two signals are added into one signal having a delay time between the delay times of the two signals by the phase interpolation. That is, the two signals are added into one signal such that the delay time of the signal outputted from the inverter Inv8 is increased, and the delay time of the signal outputted from the buffer Buf3 is decreased.

In a configuration of the differential signal generating portion 10, configurations of paths through which the input signal sig_in is applied and the differential signal is generated to the second node N2 and to the third node N3 are symmetric. The path connected to the second node N2 comprises one buffer Buf2 and the two inverters Inv7 and Inv9, and the path connected to the third node N3 also comprises one buffer Buf3 and the two inverters Inv7 and Inv8. The signals outputted from the buffers Buf2 and Buf3 and the signals outputted from the inverters Inv8 and Inv9 are phase-interpolated and then added into one signal, thereby minimizing the duty rate distortion. This is because the configurations of the buffers Buf2 and Buf3 are opposite to the configurations of the inverters Inv8 and Inv9 as can be seen in FIG. 4. That is, in the single signal-to-differential signal converters which comprise only the inverters, due to characteristics of the NMOS transistor and the PMOS transistor which constitute the inverter, the duty rate may be distorted due to a difference between a rising edge and a falling edge of the signal outputted from the inverter. However, the single signal-to-differential signal converter of the present invention has the buffers Buf2 and Buf3 as well as the inverters Inv7 to Inv9 and adds the output signals of the inverters Inv8 and Inv9 and the output signals of the buffers Buf2 and Buf3, so that the differential signals outputted at the second and third nodes N2 and N3 have the same delay time, thereby reducing the skew. Also, it has a symmetric structure and thus is less affected by the PVT variation.

When the input signal sig_in transitions from a low level to a high level, an NMOS transistor N5 of the buffer Buf2 is turned on to transition the second node N2 to a high level, and a PMOS transistor P7 of the inverter Inv9 is turned on in response to the inverted input signal sig_inB which transitions to a low level after a delay time caused by the inverter Inv7 to transition the second node N2 to a high level. The two signals applied to the second node N2 have one (1) gate skew caused by the inverter Inv7 but are matched into one signal by the phase interpolation. On the other hand, an NMOS transistor N6 of the inverter Inv8 is turned on in response to the input signal sig_in which transitions from a low level to a high level to transition the third node N3 to a low level, and a PMOS transistor P8 of the buffer Buf3 is turned on in response to the inverted input signal sig_inB which transitions to a low level after a delay time caused by the inverter Inv7 to transition the third node N3 to a low level. The two signals applied to the third node N3 have one (1) gate skew caused by the inverter Inv7 but are matched into one signal by the phase interpolation.

When the input signal sig_in transitions from a high level to a low level, the PMOS transistor P5 of the buffer Buf2 is turned on to transition the second node N2 to a low level, and the NMOS transistor N7 of the inverter Inv9 is turned on in response to the inverted input signal sig_inB which transitions to a high level after a delay time caused by the inverter Inv7 to transition the second node to a low level. The two signals applied to the second node N2 have one (1) gate skew caused by the inverter Inv7 but are matched into one signal by the phase interpolation. The PMOS transistor P6 of the inverter Inv8 is turned on in response to the input signal sig_in which transitions from a high level to a low level to transition the third node N3 to a high level, and the NMOS transistor N8 of the buffer Buf3 is turned on in response to the inverted input signal sig_inB which transitions to a high level after a delay time caused by the inverter Inv7 to transition the third node N3 to a high level. The two signals applied to the third node N3 also are matched into one signal by the phase interpolation.

The latch portion 200 includes a cross coupled latch, which itself includes two inverters Inv10 and Inv11 which are connected in parallel to each other between the second and third nodes N2 and N3. The signals outputted from the differential signal generating portion 10 have the same delay time but the opposite phase. In the cross coupled latch of FIG. 4, the inverter Inv10 inverts the signal of the third node N3 and then applies the inverted signal to the second node N2, whereas the inverter Inv11 inverts the signal of the second node N2 and then applies the inverted signal to the third node N3. Therefore, the signals of the second and third nodes N2 and N3 can transition to the other levels, so that the signal slope becomes large, and the duty rate distortion of the differential signal generated from the differential signal generating portion 10 is corrected. Since the signal slope becomes large and the duty rate distortion is reduced, the power consumption of inverters Inv12 and Inv13 is reduced, and also the SS-DS converter can stably perform the high speed operation.

The inverters Inv12 and Inv13 serve as the output driver and invert the signals of the third node N3 and the second node N2 to output the first output signal sig_out and the second output signal sig_outB, respectively.

The latch portion and the output driver may be configured with several units to correct the duty rate distortion and the slope of the differential signal.

Figure 5:
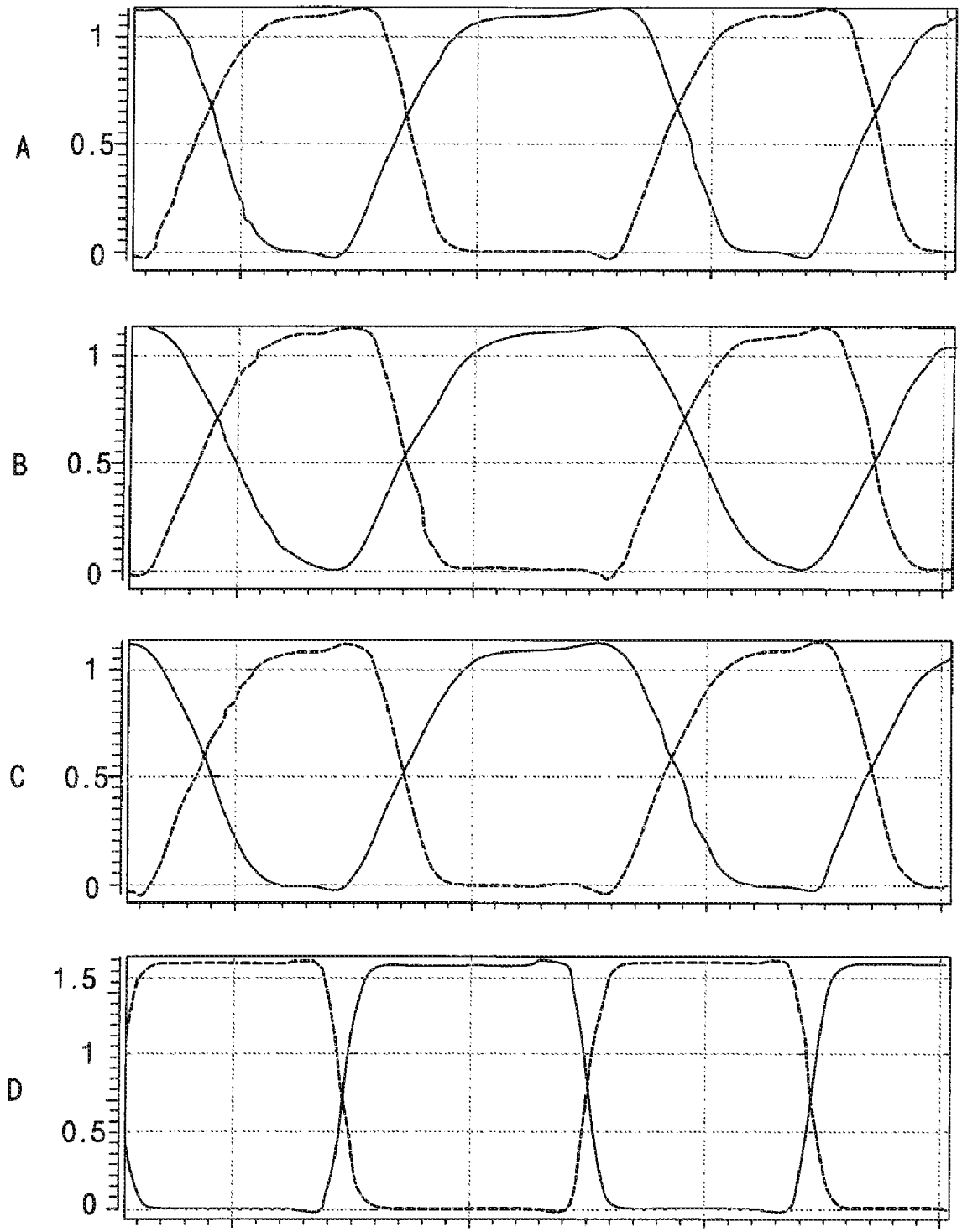
FIG. 5 is a collection of graphs that illustrate simulated output waveforms for the conventional SS-DS converter and the SS-DS converter according to an example embodiment.

FIG. 5 is a collection of graphs that illustrate simulated output waveforms for the conventional SS-DS converter and the SS-DS converter according to an example embodiment.

Figure 2:
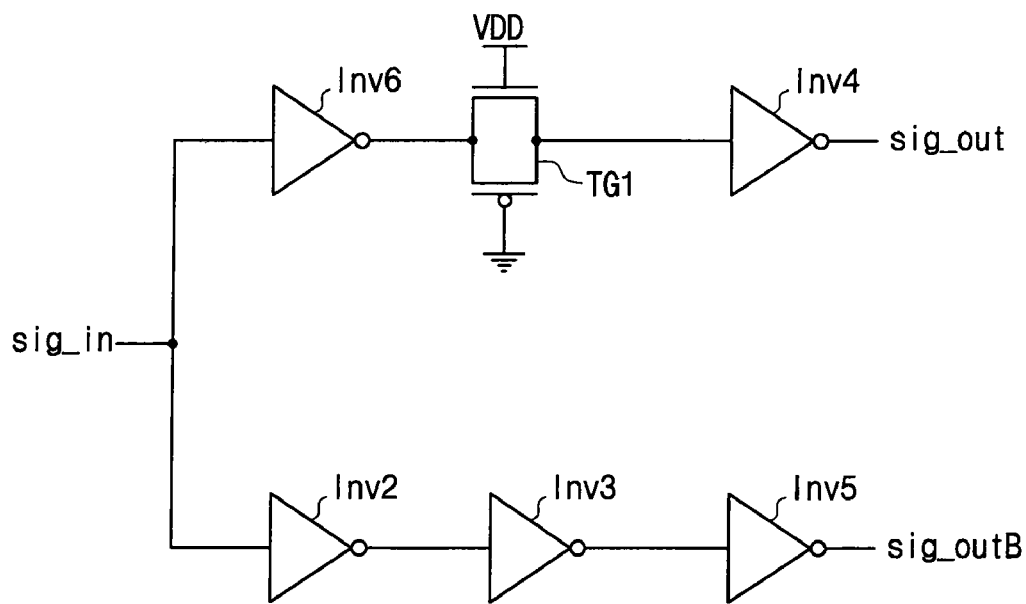
FIG. 2 is a circuit diagram illustrating a SS-DS converter according to another conventional art.
Figure 3:
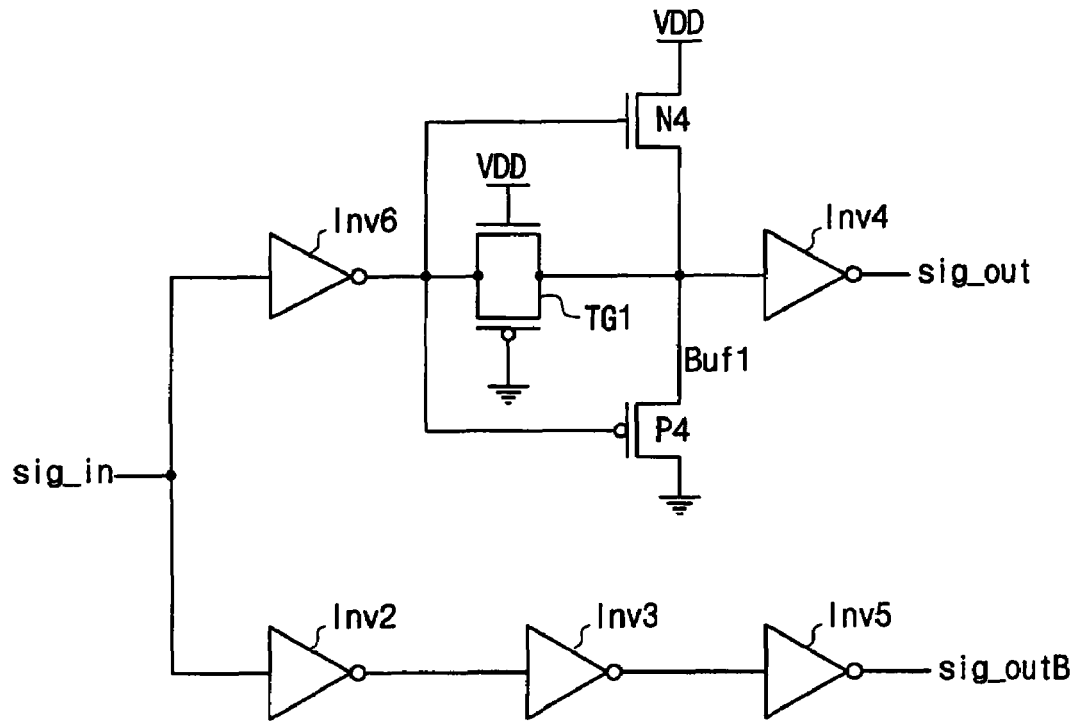
FIG. 3 is a circuit diagram illustrating a SS-DS converter which improves upon the SS-DS converter of FIG. 2.

In FIG. 5, graph "A" shows the differential signal outputted from the SS-DS converter of FIG. 1, graph "B" shows the differential signal outputted from the SS-DS converter of FIG. 2, graph "C" shows the differential signal outputted from the SS-DS converter of FIG. 3, and graph "D" shows the differential signal outputted from the SS-DS converter of FIG. 4.

As can be seen in FIG. 5, the differential signals outputted from the conventional SS-DS converters have large skew and severe duty rate distortion, whereas the differential signal outputted from the SS-DS converter according to an example embodiment has significantly reduced skew and duty rate distortion compared to the conventional SS-DS converters. In a simulation which uses an 80 nm-level 1.8V DRAM process, the skew of the graph D is improved by 80.6%, and the duty rate distortion is improved by 76.6%, compared to the waveform of the graph A. In addition, the SS-DS converter according to the example embodiment has short propagation delay time, low power consumption, and a small error caused from the PVT variation, and it can stably perform high speed operations.

The differential signal outputted from the SS-DS converter of the illustrated example embodiment is excellent in the signal margin and the time margin compared to that which is outputted from the conventional SS-DS converter.

The SS-DS converter according to example embodiments outputs a differential signal having small skew and duty rate distortion and thus it can effectively cope with the PVT variation and also support high speed operation.

As described above, according to the SS-DS converter and the SS-DS converting method of example embodiments, a differential signal having relatively small skew and duty rate distortion is outputted by using the phase interpolation method and the symmetric structure, whereby it can effectively cope with the PVT variation and support high speed operation.

What is claimed is:

1. A single signal-to-differential signal converter, comprising:
    a first inverter for receiving and inverting a single input signal and outputting an inverted single input signal to a first node;
    a first differential signal generating portion for generating a first signal and an inverted first signal which have the opposite phases to each other to second and third nodes in response to the single input signal; and
    a second differential signal generating portion for generating a second signal and an inverted second signal which have the opposite phases to each other to the second and third nodes in response to the inverted single input signal,
    wherein the single signal-to-differential signal converter outputs differential signals such that the first and second signals applied to the second node are merged by a phase interpolation and the inverted first and second signals applied to the third node are merged by a phase interpolation.

2. The single signal-to-differential signal converter of claim 1, wherein the first differential signal generating portion comprises
    a first buffer for buffering the input signal to output the first signal to the second node; and
    a second inverter for inverting the input signal to output the inverted first signal to the third node.

3. The single signal-to-differential signal converter of claim 2, wherein the second differential signal generating portion comprises
    a third inverter for inverting the inverted input signal to output the second signal to the second node; and
    a second buffer for buffering the inverted input signal to outputting the inverted second signal to the third node.

4. The single signal-to-differential signal converter of claim 3, further comprising, an output driver for externally outputting the differential signals generated at the second and third nodes.

5. The single signal-to-differential signal converter of claim 4, wherein the output driver comprises
    a fourth inverter for inverting the signal of the second node and outputting the inverting result; and
    a fifth inverter for inverting the signal of the third node and outputting the inverting result.

6. The single signal-to-differential signal converter of claim 4, further comprising, a latch portion for adjusting a rising/falling transition time of the differential signals generated at the second and third nodes.

7. The single signal-to-differential signal converter of claim 6, wherein the latch portion comprises
    a sixth inverter for inverting the signal of the second node and outputting the inverting result to the third node; and
    a seventh inverter for inverting the signal of the third node and outputting the inverting result to the second node.

8. The single signal-to-differential signal converter of claim 6, further comprising, at least one additional latch portion for adjusting a rising/falling transition time of the differential signals generated from the output driver and at least one additional output driver, wherein the at least one additional latch portion and the at least one additional output driver are alternately connected.

9. A method for converting a single signal to a differential signal, the method comprising:
    generating a first signal pair in which phases are opposite to each other in response to an input signal;
    inverting the input signal to generate an inverted input signal;
    generating a second signal pair in which phases are opposite to each other in response to the inverted input signal; and
    merging signals having the same phase from the first signal pair and the second signal pair by a phase interpolation to generate a differential signal pair, thereby offsetting a delay time difference of the first and second signal pairs.

10. The method of claim 9, wherein the step of generating the first signal pair comprises:
    buffering the input signal to output a first signal; and
    inverting the input signal to output an inverted first signal.

11. The method of claim 10, wherein the step of generating the second signal pair comprises:
    inverting the inverted input signal to output a second signal; and
    buffering the inverted input signal to output an inverted second signal.

12. The method of claim 11, further comprising externally outputting the differential signal pair.

13. The method of claim 12, wherein externally outputting the differential signal pair comprises inverting the differential signal pair and then outputting a result of inverting the differential signal pair.

14. The method of claim 12, further comprising adjusting a rising/falling transition time of the differential signal pair.

15. The method of claim 14, wherein adjusting the rising/falling transition time of the differential signal pair comprises:
    inverting a differential signal of the differential signal pair to adjust a rising/falling transition time of an inverted differential signal; and
    inverting the inverted differential signal of the differential signal pair to adjust a rising/falling transition time of the differential signal.

* * * * *